United States Patent
Li et al.

(10) Patent No.: US 12,414,376 B2
(45) Date of Patent: Sep. 9, 2025

(54) DRIVING APPARATUS, DISPLAY APPARATUS, AND METHOD OF FABRICATING DRIVING APPARATUS

(71) Applicant: BOE Technology Group Co., Ltd., Beijing (CN)

(72) Inventors: Tianji Li, Beijing (CN); Fei Yang, Beijing (CN); Mingi Chu, Beijing (CN); Yi Chen, Beijing (CN); Lirong Wang, Beijing (CN); Yu Wang, Beijing (CN); Zhiqiang Dong, Beijing (CN); Jingbo Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/905,002

(22) PCT Filed: Nov. 18, 2021

(86) PCT No.: PCT/CN2021/131476
§ 371 (c)(1),
(2) Date: Aug. 25, 2022

(87) PCT Pub. No.: WO2023/087210
PCT Pub. Date: May 25, 2023

(65) Prior Publication Data
US 2024/0194689 A1    Jun. 13, 2024

(51) Int. Cl.
*H10D 86/60*    (2025.01)
*H01L 25/16*    (2023.01)
*H10D 86/40*    (2025.01)

(52) U.S. Cl.
CPC .......... *H10D 86/60* (2025.01); *H01L 25/167* (2013.01); *H10D 86/441* (2025.01)

(58) Field of Classification Search
CPC .... H10D 86/441; H10D 86/60; H01L 25/167; H05K 1/118; H05K 1/189;
(Continued)

(56) References Cited

U.S. PATENT DOCUMENTS 7,514,713 B2 * 4/2009 Tsai ...................... G02F 1/1345
                                                         257/E27.113
9,411,203 B2 * 8/2016 Kimura ................... G09G 3/20
(Continued)

FOREIGN PATENT DOCUMENTS

CN      1717147 A      1/2006
CN    101266746 A      9/2008
(Continued)

OTHER PUBLICATIONS

International Search Report & Written Opinion mailed Aug. 22, 2022, regarding PCT/CN2021/131476.

*Primary Examiner* — Vinh T Lam
(74) *Attorney, Agent, or Firm* — Intellectual Valley Law, P.C.

(57) ABSTRACT

A driving apparatus is provided. The driving apparatus includes an integrated circuit chip; an input wiring pattern connected to the integrated circuit chip, and configured to be connected to a circuit board; and an output wiring pattern including a plurality of output wires connected to the integrated circuit chip, and configured to be connected to a display panel. The plurality of output wires are arranged in a first bonding region, at least two output wires of the plurality of output wires have different average line widths.

20 Claims, 11 Drawing Sheets

(58) Field of Classification Search
CPC .......... H05K 2201/09781; H05K 2201/10128;
H10K 59/131; G09G 2300/0408; G09G
3/32; G09G 2300/0426
See application file for complete search history.

(56) References Cited

U.S. PATENT DOCUMENTS

| | | | |
|---|---|---|---|
| 10,102,813 B2* | 10/2018 | Heo | H10K 59/12 |
| 10,600,820 B2* | 3/2020 | Luo | H10D 86/60 |
| 10,877,329 B2* | 12/2020 | Kimura | H05K 1/148 |
| 10,897,819 B2* | 1/2021 | Wu | H05K 3/361 |
| 11,361,692 B2* | 6/2022 | Huang | G09G 3/20 |
| 11,501,674 B2* | 11/2022 | Eom | G02F 1/13458 |
| 11,520,193 B2* | 12/2022 | Kimura | G02F 1/133345 |
| 11,783,740 B2* | 10/2023 | Fan | H10K 59/131 345/214 |
| 11,900,862 B2* | 2/2024 | Zhang | G09G 3/2092 |
| 11,948,494 B2* | 4/2024 | Bai | G06F 3/04164 |
| 12,199,108 B2* | 1/2025 | Xu | H10D 86/443 |
| 2008/0231165 A1* | 9/2008 | Lee | H01J 31/127 313/495 |
| 2009/0167731 A1 | 7/2009 | Ito | |
| 2011/0069432 A1 | 3/2011 | Chang et al. | |
| 2013/0083487 A1 | 4/2013 | Kim et al. | |
| 2015/0187294 A1* | 7/2015 | Chen | G09G 3/3685 345/98 |
| 2018/0108292 A1 | 4/2018 | Xu | |
| 2019/0033646 A1 | 1/2019 | Shimizu et al. | |
| 2019/0059156 A1 | 2/2019 | Kwon et al. | |
| 2019/0164877 A1 | 5/2019 | Cho et al. | |
| 2020/0295114 A1 | 9/2020 | Moon et al. | |
| 2020/0328172 A1* | 10/2020 | Lu | H05K 1/111 |
| 2022/0151076 A1 | 5/2022 | Yoo et al. | |

FOREIGN PATENT DOCUMENTS

| | | |
|---|---|---|
| CN | 101504493 A | 8/2009 |
| CN | 102033340 A | 4/2011 |
| CN | 103035169 A | 4/2013 |
| CN | 103338582 A | 10/2013 |
| CN | 104678621 A | 6/2015 |
| CN | 205428453 U | 8/2016 |
| CN | 108022516 A | 5/2018 |
| CN | 109076699 A | 12/2018 |
| CN | 109407425 A | 3/2019 |
| CN | 109860142 A | 6/2019 |
| CN | 111698823 A | 9/2020 |
| CN | 112289836 A | 1/2021 |
| CN | 214042885 U | 8/2021 |
| CN | 113539114 A | 10/2021 |
| CN | 114501774 A | 5/2022 |
| JP | 2003273476 A | 9/2003 |
| JP | 2003273486 A | 9/2003 |
| JP | 2004186472 A | 7/2004 |

* cited by examiner

DRIVING APPARATUS, DISPLAY APPARATUS, AND METHOD OF FABRICATING DRIVING APPARATUS

CROSS-REFERENCE TO RELATED APPLICATION

This application is a national stage application under 35 U.S.C. § 371 of International Application No. PCT/CN2021/131476, filed Nov. 18, 2021, the contents of which are incorporated by reference in the entirety.

TECHNICAL FIELD

The present invention relates to display technology, more particularly, to a driving apparatus, a display apparatus, and a method of fabricating a driving apparatus.

BACKGROUND

In conventional display apparatuses, an integrated circuit chip may be mounted to the display apparatus by various technique, including a chip-on-glass (COG) technique, a (COF) technique, and a chip-on-plastic (COP) technique. In the COF technique, the integrated circuit chip is mounted on a film, which then couples a flexible display apparatus and a flexible printed circuit board (FPCB). In the COP technique, the integrated circuit chip is directly mounted on a plastic base substrate of the flexible display apparatus. The COP technique does not utilize the film used in the COF technique, thereby reducing the cost.

SUMMARY

In one aspect, the present disclosure provides a driving apparatus, comprising an integrated circuit chip; an input wiring pattern connected to the integrated circuit chip, and configured to be connected to a circuit board; and an output wiring pattern comprising a plurality of output wires connected to the integrated circuit chip, and configured to be connected to a display panel; wherein the plurality of output wires are arranged in a first bonding region, at least two output wires of the plurality of output wires have different average line widths.

Optionally, the plurality of output wires comprise one or more output wires of a first type having a first average line width and one or more output wires of a second type having a second average line width; and the first average line width and the second average line width are different.

Optionally, the one or more output wires of the first type are configured to transmit signals of a first type; the one or more output wires of the second type are configured to transmit signals of a second type; the signals of the first type have an average current greater than the signals of the second type; and the first average line width is greater than the second average line width.

Optionally, the one or more output wires of the first type comprise a power supply signal line; and the one or more output wires of the second type comprise a data line.

Optionally, the input wiring pattern comprises a plurality of input wires arranged in a second bonding region, at least two input wires of the plurality of input wires have different average line width.

Optionally, the plurality of input wires comprise one or more input wires of a third type having a third average line width and one or more output wires of a fourth type having a fourth average line width; and the third average line width and the fourth average line width are different.

Optionally, the one or more input wires of the third type are configured to transmit signals of a third type; the one or more input wires of the fourth type are configured to transmit signals of a fourth type; the signals of the third type have an average current greater than the signals of the fourth type; and the third average line width is greater than the fourth average line width.

Optionally, the plurality of output wires further comprise one or more output wires of a fifth type having a fifth average line width; the fifth average line width is greater than the second average line width; and the first average line width is greater than the fifth average line width.

Optionally, the one or more output wires of the first type comprise two third power supply lines; the driving apparatus comprises m number of output wires of the fifth type between the two third power supply lines, m is an integer greater than 2; and between each pair of two adjacent output wires of the m number of output wires of the fifth type, the driving apparatus comprises n number of output wires of the second type, n is an integer greater than 2.

Optionally, the one or more output wires of the first type comprise a power supply signal line; the one or more output wires of the second type comprise a data line; and the one or more output wires of the fifth type comprise a sense line.

Optionally, the driving apparatus further comprises, in the first bonding region, one or more dummy lines that are floating; wherein a respective dummy line is between two adjacent output wires of the first type of the one or more output wires of the first type to prevent short.

Optionally, the plurality of input wires further comprise one or more input wires of a seventh type having a seventh average line width; the seventh average line width is greater than the fourth average line width; and the third average line width is greater than the seventh average line width.

Optionally, the one or more input wires of the third type comprise two third power supply lines; the driving apparatus comprises m number of input wires of the seventh type between the two third power supply lines, m is an integer greater than 2; and between each pair of two adjacent input wires of the m number of input wires of the seventh type, the driving apparatus comprises n number of input wires of the fourth type, n is an integer greater than 2.

Optionally, the driving apparatus further comprises, in the second bonding region, one or more dummy lines that are floating; wherein a respective dummy line is between two adjacent input wires of the third type of the one or more input wires of the third type to prevent short.

Optionally, the input wiring pattern comprises a plurality of input wires arranged in a second bonding region; and a first shortest distance along a direction across the plurality of output wires between two outmost output wires is greater than a second shortest distance along a direction across the plurality of input wires between two outmost input wires.

Optionally, the driving apparatus further comprises a base substrate; wherein the input wiring pattern comprises a plurality of input wires arranged in a second bonding region; the output wiring pattern and the input wiring pattern on the base substrate; the plurality of output wires are arranged along a first side of the base substrate; the plurality of input wires are arranged along a second side of the base substrate; and the first side is wider than the second side.

Optionally, the base substrate has a trapezoidal shape.

Optionally, the base substrate comprises a first portion having a rectangular shape and a second portion having a trapezoidal shape; a long side of the trapezoidal shape connected to the rectangular shape; the plurality of output wires are on the first portion; and the plurality of input wires are on the second portion.

Optionally, the driving apparatus is a chip-on-film.

In another aspect, the present disclosure provides a display apparatus, comprising the driving apparatus described herein or fabricated by a method described herein, the circuit board connected to the input wiring pattern, and the display panel comprising a plurality of bonding pads bonded to the plurality of output wires, respectively.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a driving apparatus, a display apparatus, and a method of fabricating a driving apparatus that substantially obviate one or more of the problems due to limitations and disadvantages of the related art. In one aspect, the present disclosure provides a driving apparatus. In some embodiments, the driving apparatus includes an integrated circuit chip; an input wiring pattern connected to the integrated circuit chip, and configured to be connected to a circuit board; and an output wiring pattern comprising a plurality of output wires connected to the integrated circuit chip, and configured to be connected to a display panel. Optionally, the plurality of output wires are arranged in a first bonding region, at least two output wires of the plurality of output wires have different average line widths.

Figure 1A:
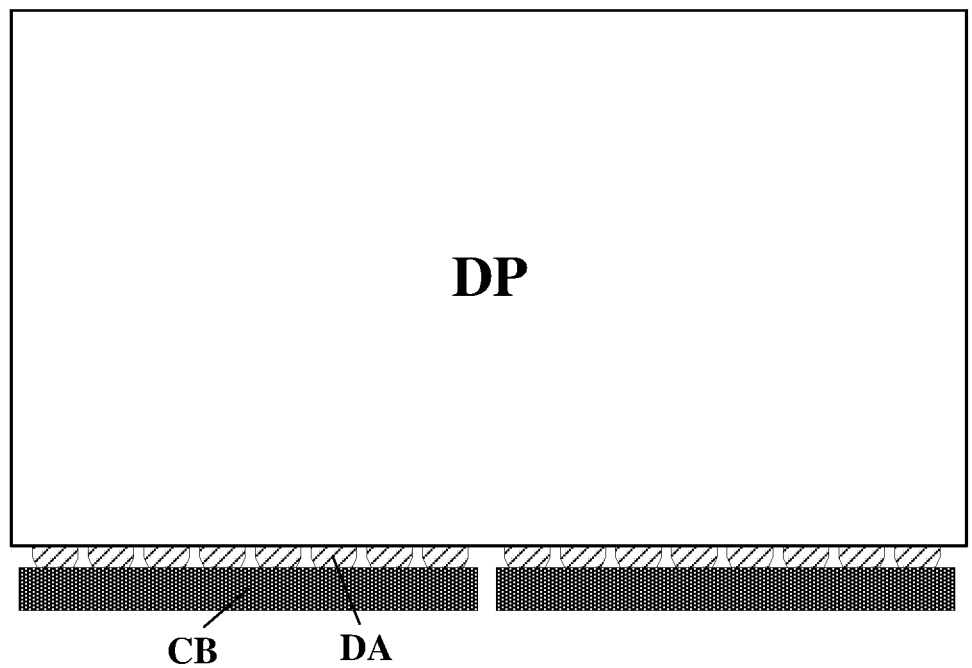
FIG. 1A is a diagram illustrating a plan view of a display apparatus in some embodiments according to the present disclosure.

FIG. 1A is a diagram illustrating a plan view of a display apparatus in some embodiments according to the present disclosure. Referring to FIG. 1A, the display apparatus in some embodiments includes a driving apparatus DA, a circuit board CB connected to the driving apparatus DA, and a display panel DP connected to the driving apparatus DA. Optionally, the circuit board CB is a printed circuit board. Optionally, the driving apparatus is selected from a group consisting of a chip-on-film, a chip-on-glass, chip-on-plastic, and a tape automated bonding. FIG. 1A shows a plurality of driving apparatuses, each of the plurality of driving apparatuses connects a respective circuit board to the display panel DP. In one example as shown in FIG. 1A, the display apparatus includes a plurality of circuit boards.

Various appropriate driving apparatuses may be implemented in the present disclosure. In one example, the driving apparatus DA is a gate driving apparatus configured to provide, inter alia, gate driving signals to the display panel DP. In another example, the driving apparatus DA is a data driving apparatus configured to provide, inter alia, data driving signals to the display panel DP. In another example, the driving apparatus DA is a touch control driving apparatus configured to provide, inter alia, touch control driving signals to the display panel DP.

Figure 1B:
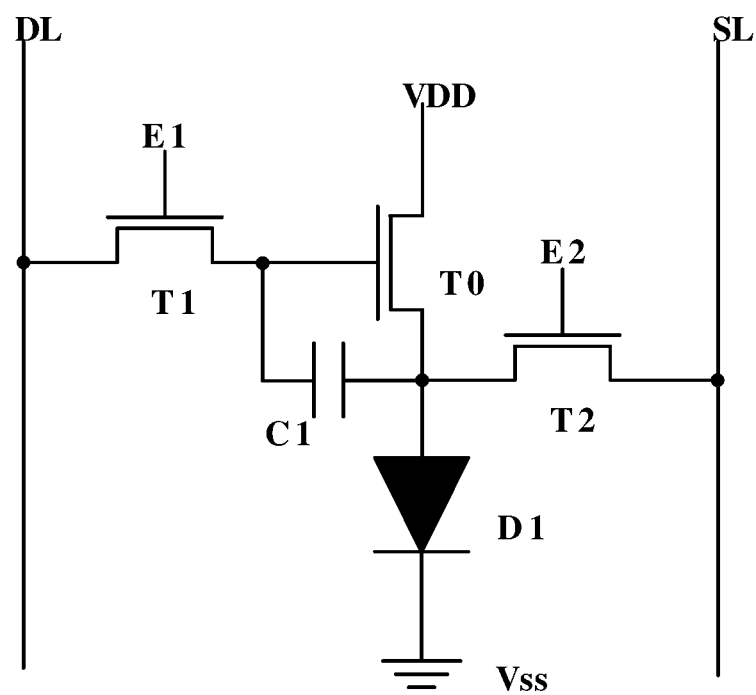
FIG. 1B is a circuit diagram of a pixel driving circuit in a display apparatus in some embodiments according to the present disclosure.

FIG. 1B is a circuit diagram of a pixel driving circuit in a display apparatus in some embodiments according to the present disclosure. Referring to FIG. 1B, the pixel circuit in some embodiments includes a driving transistor T0, a first transistor T1, a second transistor T2, a storage capacitor C1, and a light-emitting diode D1. The first transistor T1 includes a gate coupled to a first scan line E1, a first electrode coupled to a data line DL, and a second electrode coupled to the gate of the driving transistor. The first transistor T1 is configured to connect or disconnect the data line DL to or from the gate of the driving transistor T0 under controls of the voltage signal from the first scan line E1. The second transistor T2 includes a gate coupled to a second scan line E2, a first electrode coupled to the second electrode of the driving transistor T0 and a first electrode of the light-emitting diode D1, and a second electrode coupled to the sense line SL. The second transistor T2 is configured to connect or disconnect the second electrode of the driving transistor T0 to or from the sense line SL under controls of the voltage signal from the second scan line E2. The storage capacitor C1 is disposed between the gate and the second electrode of the driving transistor T0 and is configured to store a data voltage applied to the pixel circuit. The storage capacitor C1 is also configured to clamp the gate and the second electrode with a voltage bootstrapping effect.

Additionally, the first electrode of the driving transistor T0 is coupled to a first power supply line VDD. The second electrode of the light-emitting diode D1 is coupled to a second power supply line Vss. Optionally, the first electrode and the second electrode of each transistor mentioned above can be either a source electrode or a drain electrode, which are symmetrically laid therein. Optionally, the source electrode and the drain electrode can be set properly to respective first electrode or second electrode based on specific transistor type to match the current direction accordingly.

In an embodiment, the display apparatus includes multiple pixel circuits arranged in a matrix with multiple rows and columns. Each row of pixel circuits shares a same (first) scan line E1 and a same (second) scan line E2. Each column of pixel circuits shares a same sense line SL and a same data line DL. Accordingly, at least one process of applying data voltage to the pixel circuits, compensating the data voltage, and monitoring the data-compensation parameters to a particular pixel circuit in the matrix can be performed according to its row/column address therein.

Figure 1C:
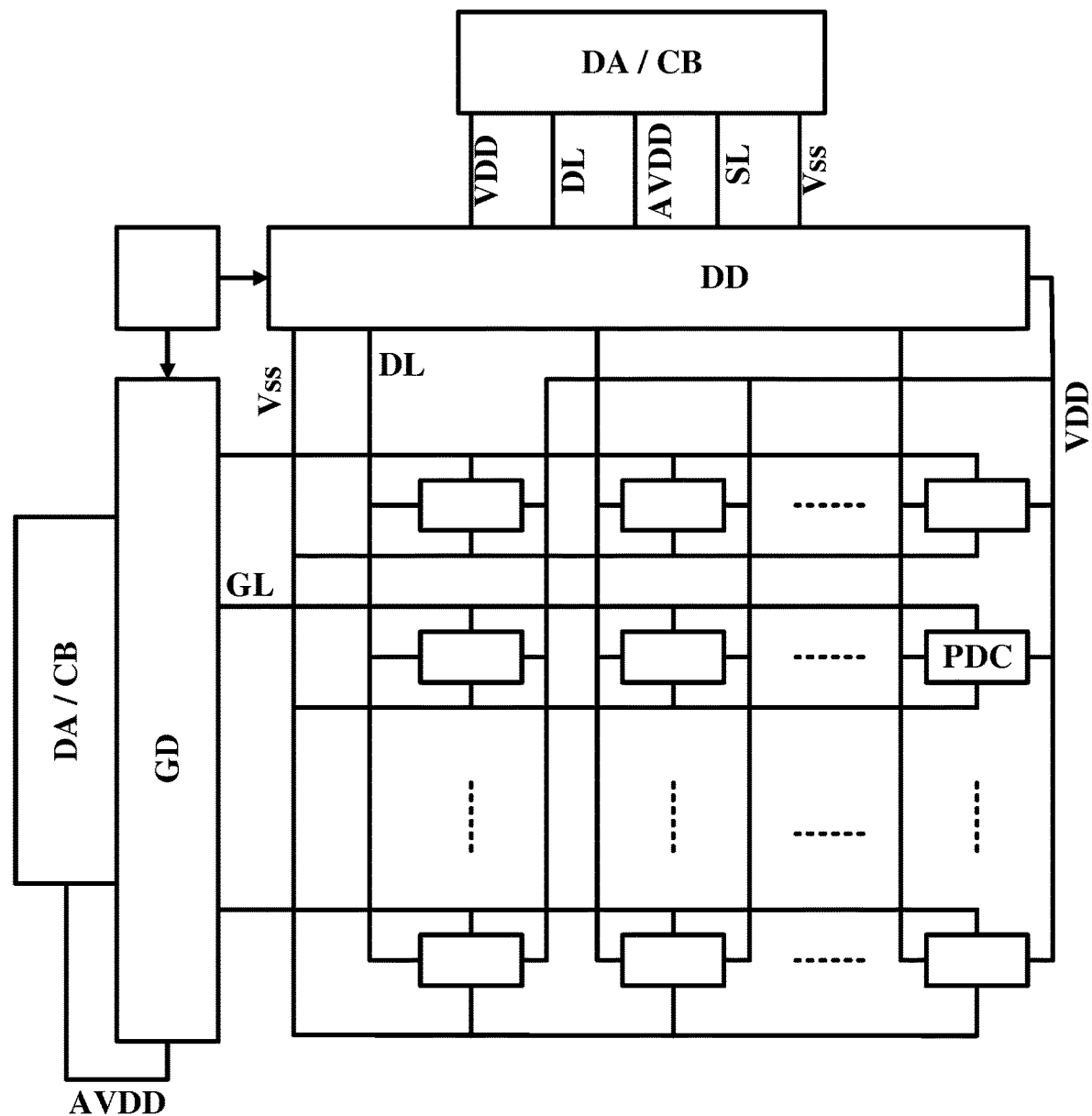
FIG. 1C is a schematic diagram illustrating the structure of a display apparatus in some embodiments according to the present disclosure.

FIG. 1C is a schematic diagram illustrating the structure of a display apparatus in some embodiments according to the present disclosure. Referring to FIG. 1C, the display apparatus includes a plurality of pixel driving circuits PDC, a gate driver GD configured to provide gate signals to the plurality of pixel driving circuits PDC, and a data driver DD configured to provide data signals to the plurality of pixel driving circuits PDC. The gate driver GD and the data driver DD are coupled to the driving apparatus DA and the circuit board CB. In one example, the driving apparatus DA and the circuit board CB are configured to provides a first power supply signal to the data driver DD though one or more first power supply line VDD, a second power supply signal to the data driver DD though one or more second power supply line Vss, a third power supply signal to the data driver DD though one or more third power supply line AVDD, data signals to the data driver DD though data lines DL, and sensing signals to the data driver DD though sense lines SL. The third power supply line AVDD is configured to provide an analog supply voltage to a driver (e.g., the data driver or the gate driver) for generating, e.g., a gamma voltage.

Figure 2:
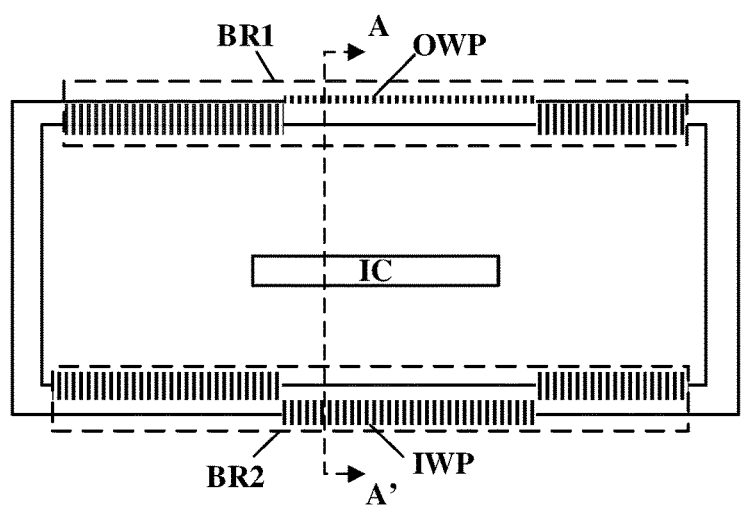
FIG. 2 is a schematic diagram illustrating the structure of a driving apparatus in some embodiments according to the present disclosure.

FIG. 2 is a schematic diagram illustrating the structure of a driving apparatus in some embodiments according to the present disclosure. Referring to FIG. 2, the driving apparatus in some embodiments includes an integrated circuit chip IC, an input wiring pattern IWP connected to the integrated circuit chip IC, and an output wiring pattern OWP connected to the integrated circuit chip IC. Optionally, referring to FIG. 1A and FIG. 2, the input wiring pattern IWP is configured to be connected to the circuit board CB, and the output wiring pattern OWP is configured to be connected to the display panel DP.

Figure 3:
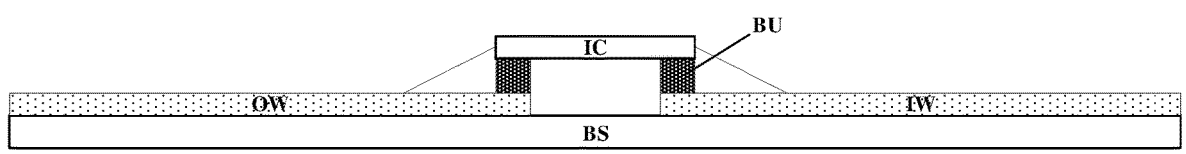
FIG. 3 is a cross-sectional view along an A-A' line in FIG. 2.

FIG. 3 is a cross-sectional view along an A-A' line in FIG. 2. Referring to FIG. 2 and FIG. 3, in some embodiments, the input wiring pattern IWP includes a plurality of input wires IW arranged in a second bonding region BR2 and on a base substrate BS, and the output wiring pattern OWP includes a plurality of output wires OW arranged in a first bonding region BR1 and on the base substrate BS. A respective input wire or a respective output wire is connected to the integrated circuit chip IC through a gold bump BU, as shown in FIG. 3. In one example, the base substrate BS is a film.

In some embodiments, at least two output wires of the plurality of output wires OW have different average line widths. For example, the plurality of output wires OW have a non-uniform average line widths distribution.

In related driving apparatuses, the output wires are typically made of a same average width, and the input wires are typically made of a same average width. With the display apparatuses being made of increasing sizes, voltages or currents of the driving signals correspondingly increase to sufficiently drive the display apparatuses of a large size. The large voltage or current transmitting through the driving apparatuses make them prone to overheating problems.

The present driving apparatus obviates this issue by having at least two output wires of the plurality of output wires have different average line widths. In some embodiments, the plurality of output wires include one or more output wires of a first type having a first average line width and one or more output wires of a second type having a second average line width. In one example, the output wires configured to transmit a relatively large current are made of a relatively larger average line width, while the output wires configured to transmit a relatively small current are made of a relatively smaller average line width. By selectively increasing line widths of certain wires in the driving apparatus, without uniformly increasing line widths of all wires in the driving apparatus, the size of the driving apparatus can be maintained within a limit that is compatible with industry standard.

Figure 4:
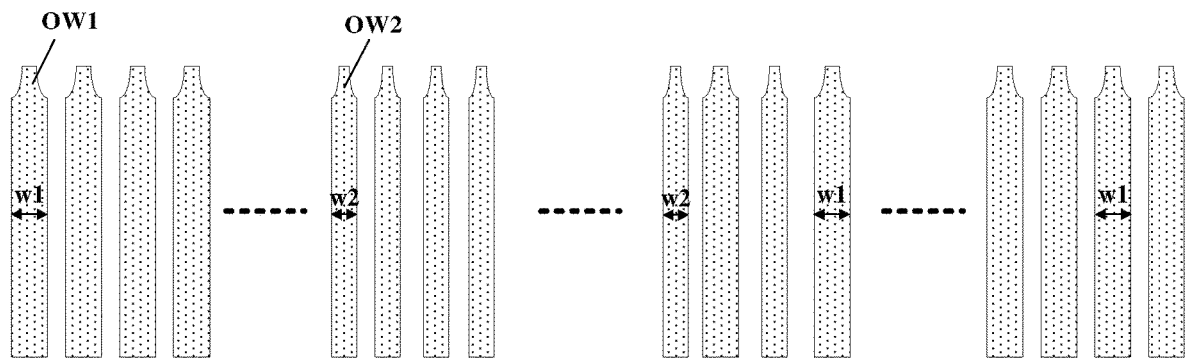
FIG. 4 illustrates a plurality of output wires in a portion of a first bonding region in a driving apparatus in some embodiments according to the present disclosure.

FIG. 4 illustrates a plurality of output wires in a portion of a first bonding region in a driving apparatus in some embodiments according to the present disclosure. Referring to FIG. 4, the plurality of output wires in some embodiments includes one or more output wires OW1 of a first type having a first average line width w1 and one or more output wires OW2 of a second type having a second average line width w2. Optionally, the first average line width w1 and the second average line width w2 are different from each other. The wires of different types may be clustered by individual types so that wires of different types may be arranged in different clusters. Optionally, the wires of different types may be intermixed, for example, at least a portion of the first bonding region includes wires of different types alternately arranged.

In some embodiments, the one or more output wires OW1 of the first type are configured to transmit signals of a first type. The one or more output wires OW2 of the second type are configured to transmit signals of a second type. Signals of a same type have similar characteristics and are configured to perform similar functions. For example, data driving signals are configured to provide data signals to subpixels in the display panel, and typically have a same or similar waveform. In another example, power supply lines are configured to provide power supply signals to pixel driving circuits in the display panel, and typically have a same or similar waveform. As discussed above, the output wires configured to transmit a type of signal characterized by a relatively large current may be made of a relatively larger average line width, and output wires configured to transmit a type of signal characterized by a relatively small current may be made of a relatively smaller average line width. In some embodiments, the signals of the first type have an average current greater than the signals of the second type, and the first average line width is greater than the second average line width.

Examples of output wires configured to transmit a type of signal characterized by a relatively large current include a first power supply line (e.g., configured to transmit a VDD signal), a second power supply line (e.g., configured to transmit a VSS signal), and a sense line. Examples of output wires configured to transmit a type of signal characterized by a relatively small current include a data line, a gate line, and a touch signal line. In one example, the one or more output wires OW1 of the first type include a power supply signal line, and the one or more output wires OW2 of the second type include a data line.

In some embodiments, at least two input wires of the plurality of output wires have different average line widths. For example, the plurality of input wires IW have a non-uniform average line widths distribution.

As discussed above, in related driving apparatuses, the output wires are typically made of a same average width, and the input wires are typically made of a same average width. The large voltage or current transmitting through the driving apparatuses make them prone to overheating problems. The present driving apparatus further obviates this issue by having at least two input wires of the plurality of input wires have different average line widths. In some embodiments, the plurality of input wires include one or more input wires of a third type having a third average line width and one or more input wires of a fourth type having a fourth average line width. In one example, the input wires configured to transmit a relatively large current are made of a relatively larger average line width, while the input wires configured to transmit a relatively small current are made of a relatively smaller average line width. By selectively increasing line widths of certain wires in the driving apparatus, without uniformly increasing line widths of all wires in the driving apparatus, the size of the driving apparatus can be maintained within a limit that is compatible with industry standard.

In one example, the third type is the same as the first type. Optionally, the fourth type is the same as the second type.

In another example, the third type is different from the first type. Optionally, the fourth type is different from the second type.

Figure 5:
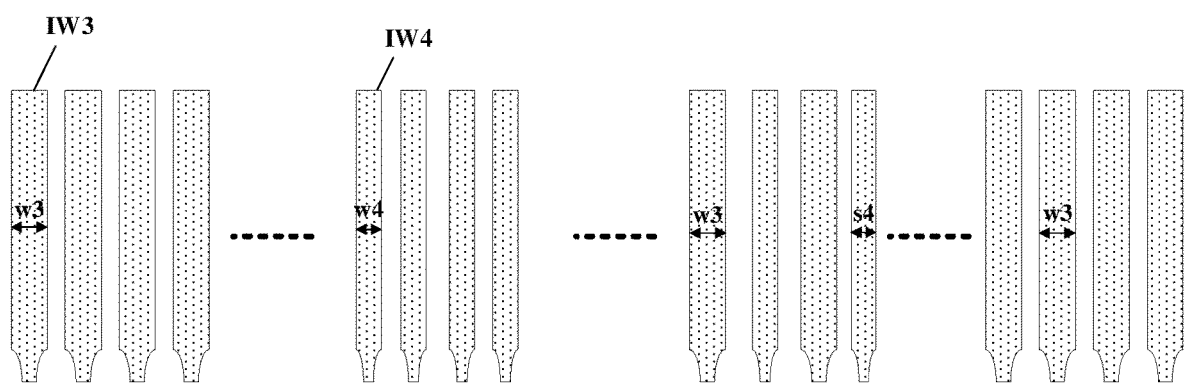
FIG. 5 illustrates a plurality of input wires in a portion of a second bonding region in a driving apparatus in some embodiments according to the present disclosure.

FIG. 5 illustrates a plurality of input wires in a portion of a second bonding region in a driving apparatus in some embodiments according to the present disclosure. Referring to FIG. 5, the plurality of input wires in some embodiments includes one or more input wires IW3 of a third type having a third average line width w3 and one or more input wires IW4 of a fourth type having a fourth average line width w4. Optionally, the third average line width w3 and the fourth average line width w4 are different from each other. The wires of different types may be clustered by individual types so that wires of different types may be arranged in different clusters. Optionally, the wires of different types may be intermixed, for example, at least a portion of the second bonding region includes wires of different types alternately arranged.

In some embodiments, the one or more input wires IW3 of the third type are configured to transmit signals of a third type. The one or more output wires IW4 of the fourth type are configured to transmit signals of a fourth type. In some embodiments, the signals of the third type have an average current greater than the signals of the fourth type, and the third average line width w3 is greater than the fourth average line width w4.

In one example, the third average line width w3 is the same as the first average line width w1. Optionally, the fourth average line width w4 is the same as the second average line width w2.

In one example, the third average line width w3 is different from the first average line width w1. Optionally, the fourth average line width w4 is different from the second average line width w2.

Depending on a number of types of signal lines in the first bonding region or the second bonding region, the output wires in the first bonding region may have more than two different average line widths, and/or the input wires in the second bonding region may have more than two different average line widths.

Figure 6:
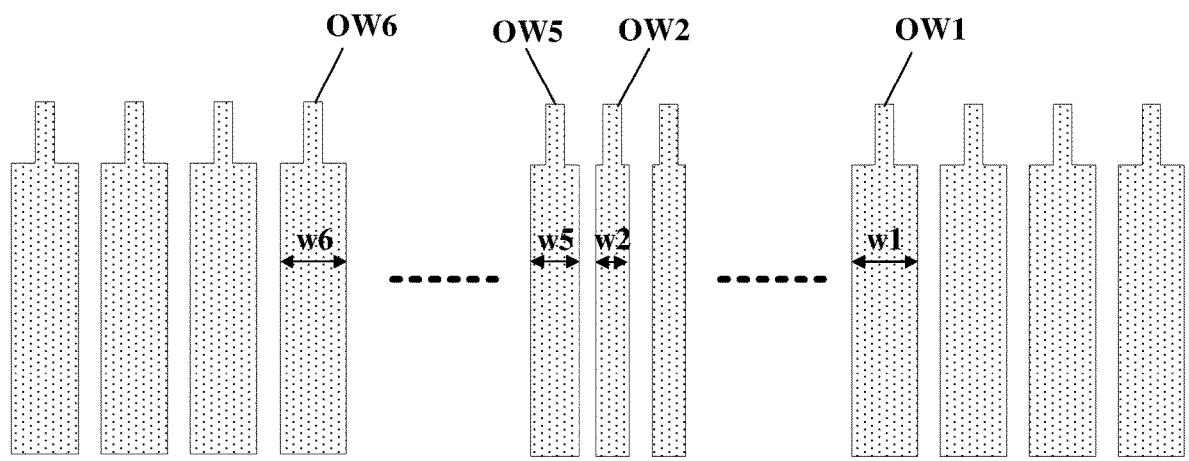
FIG. 6 illustrates a plurality of output wires in a portion of a first bonding region in a driving apparatus in some embodiments according to the present disclosure.

FIG. 6 illustrates a plurality of output wires in a portion of a first bonding region in a driving apparatus in some embodiments according to the present disclosure. Referring to FIG. 6, the plurality of output wires in the first bonding region includes one or more output wires OW1 of a first type having a first average line width w1, one or more output wires OW2 of a second type having a second average line width w2, one or more output wires OW5 of a fifth type having a fifth average line width w5, one or more output wires OW6 of a sixth type having a sixth average line width w6. Optionally, the first average line width w1, the second average line width w2, the fifth average line width w5, and the sixth average line width w6 are different from each other.

In some embodiments, the one or more output wires OW2 are one or more data lines. The one or more output wires OW5 are one or more sense lines. The one or more output wires OW1 and the one or more output wires OW6 are passlines. Examples of passlines include a first power supply line and a second power supply line. Typically, the passlines are disposed on one or both sides of the bonding region.

Figure 7:
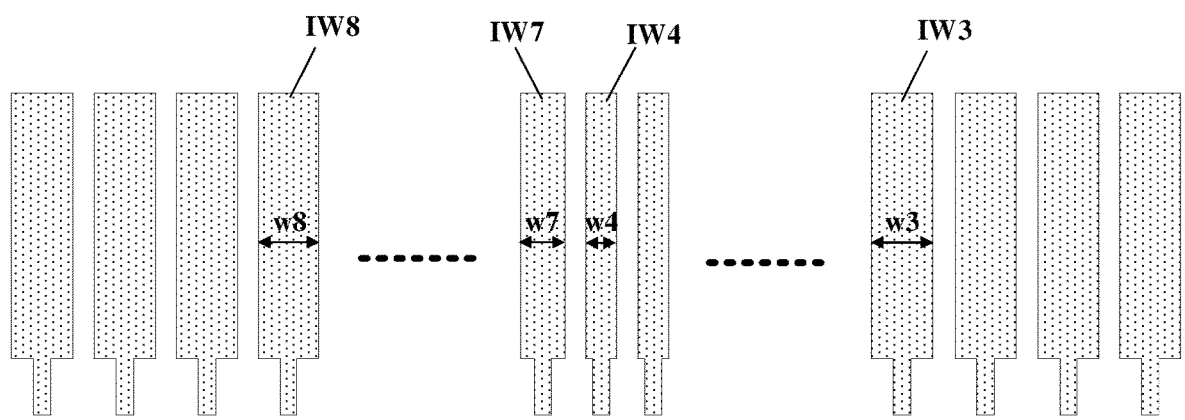
FIG. 7 illustrates a plurality of input wires in a portion of a second bonding region in a driving apparatus in some embodiments according to the present disclosure.

FIG. 7 illustrates a plurality of input wires in a portion of a second bonding region in a driving apparatus in some embodiments according to the present disclosure. Referring to FIG. 7, the plurality of input wires in some embodiments includes one or more input wires IW3 of a third type having a third average line width w3, one or more input wires IW4 of a fourth type having a fourth average line width w4, one or more input wires IW7 of a seventh type having a seventh average line width w7, one or more input wires IW8 of an eighth type having an eighth average line width w8. Optionally, the third average line width w3, the fourth average line width w4, the seventh average line width w7, and the eighth average line width w8 are different from each other.

In one example, the third type is the same as the first type. Optionally, the fourth type is the same as the second type. Optionally, the seventh type is the same as the fifth type. Optionally, the eighth type is the same as the sixth type.

In another example, the third type is different from the first type. Optionally, the fourth type is different from the second type. Optionally, the seventh type is different from the fifth type. Optionally, the eighth type is different from the sixth type.

In one example, the third average line width w3 is the same as the first average line width w1. Optionally, the fourth average line width w4 is the same as the second average line width w2. Optionally, the seventh average line width w7 is the same as the fifth average line width w5. Optionally, the eighth average line width w8 is the same as the sixth average line width w6.

In one example, the third average line width w3 is different from the first average line width w1. Optionally, the fourth average line width w4 is different from the second average line width w2. Optionally, the seventh average line width w7 is different from the fifth average line width w5. Optionally, the eighth average line width w8 is different from the sixth average line width w6.

In some embodiments, the one or more input wires IW4 are one or more data lines. The one or more input wires IW7 are one or more sense lines. The one or more input wires IW3 and the one or more input wires IW8 are passlines. Examples of passlines include a first power supply line and a second power supply line. Typically, the passlines are disposed on one or both sides of the bonding region.

Figure 8:
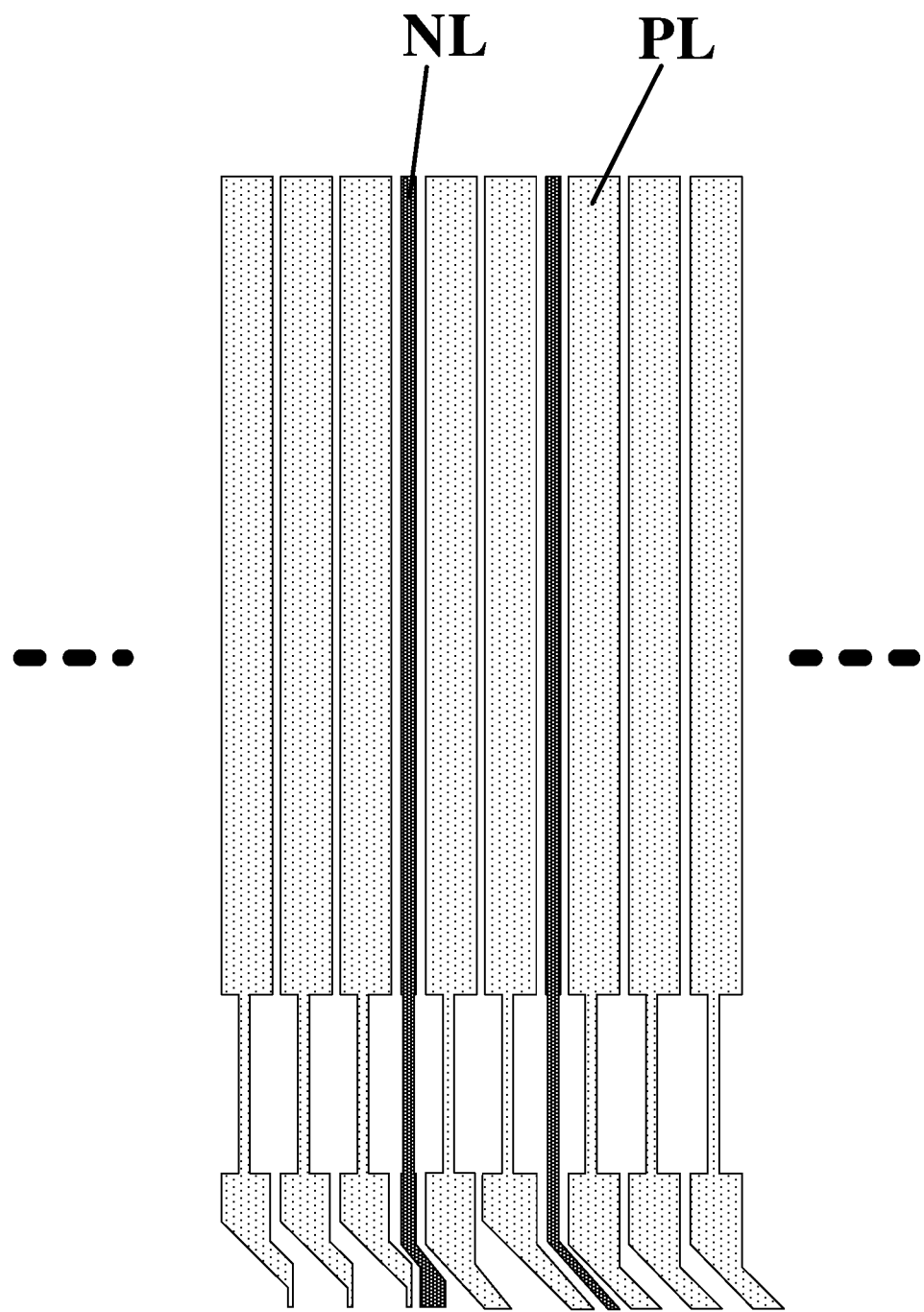
FIG. 8 illustrates a plurality of wires in a portion of a bonding region in a driving apparatus in some embodiments according to the present disclosure.

FIG. 8 illustrates a plurality of wires in a portion of a bonding region in a driving apparatus in some embodiments according to the present disclosure. Referring to FIG. 8, the wires may be output wires in the first bonding region or input wires in the second bonding region. In the portion of the bonding region, the driving apparatus includes a plurality of passlines PL. Passlines typically are configured to transmit signals having a relatively large current or a relatively large voltage. Adjacent passlines are prone to short when signals transmitted therein have a relatively large voltage difference. As shown in FIG. 8, the driving apparatus in some embodiments further includes one or more dummy lines NL. A respective dummy line is between two adjacent passlines to prevent short.

Accordingly, in some embodiments, the driving apparatus further includes, in the first bonding region, one or more dummy lines that are floating. Optionally, a respective dummy line is between two adjacent output wires of the first type of the one or more output wires of the first type to prevent short.

In some embodiments, the driving apparatus further includes, in the second bonding region, one or more dummy lines that are floating. Optionally, a respective dummy line is between two adjacent input wires of the third type of the one or more input wires of the third type to prevent short.

Figure 9:
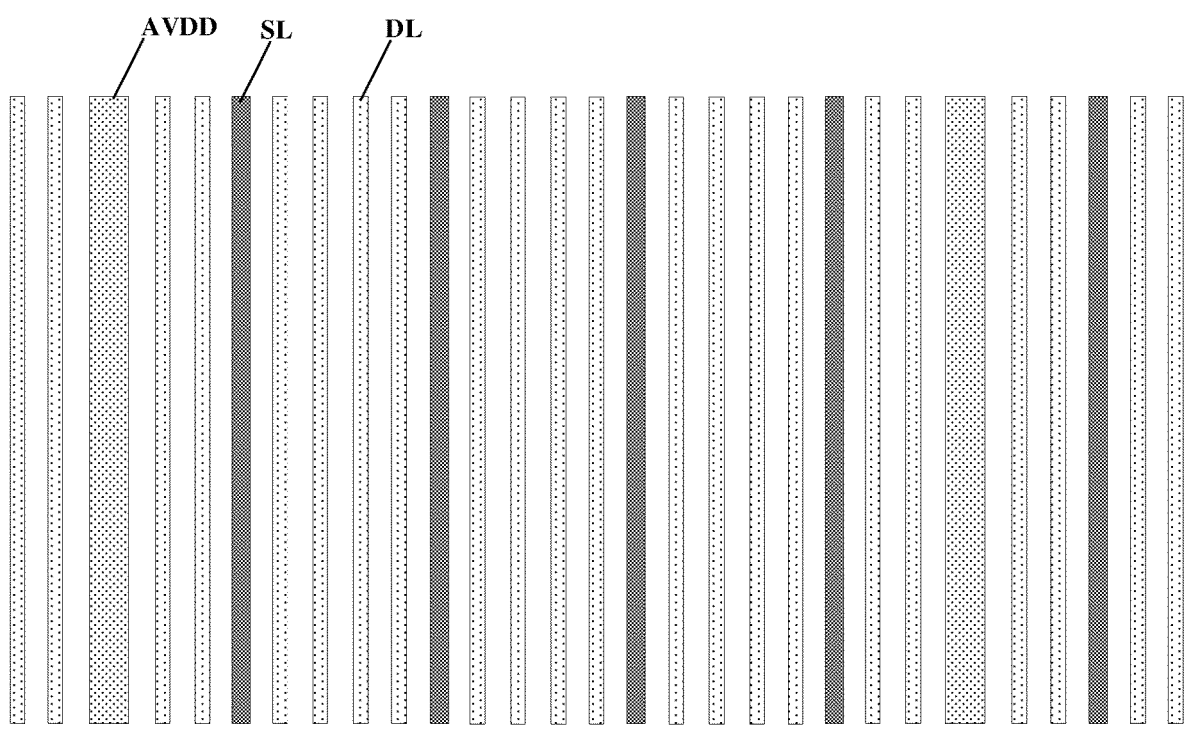
FIG. 9 illustrates a plurality of wires in a portion of a bonding region in a driving apparatus in some embodiments according to the present disclosure.

FIG. 9 illustrates a plurality of wires in a portion of a bonding region in a driving apparatus in some embodiments according to the present disclosure. Referring to FIG. 9, the wires may be output wires in the first bonding region or input wires in the second bonding region. In the portion of the bonding region, the driving apparatus includes data lines DL and sense line SL. In one example as depicted in FIG. 9, the driving apparatus in this portion may include four data lines between two adjacent sense lines, corresponding to a pixel arrangement format in which four subpixels share a same sense line. The driving apparatus in this portion further includes third power supply lines AVDD. In one specific example, the driving apparatus in this portion includes twenty wires (including sense lines SL and data lines DL) between two adjacent third power supply lines. An average line width of data lines DL is smaller than an average line width of sense lines SL. The average line width of sense lines SL is smaller than an average line width of third power supply lines AVDD. Typically, the third power supply lines AVDD are configured to transmit signals having a voltage level lower than that in signals transmitted by first power supply lines. Accordingly, the average line width of third power supply lines AVDD is typically smaller than an average line width of first power supply lines.

Accordingly, in some embodiments, the one or more output wires of the first type include two third power supply lines AVDD. The driving apparatus includes m number of output wires of the fifth type (e.g., sense lines SL) between the two third power supply lines AVDD, m is an integer greater than 2 (e.g., 3, 4, 5, 6, 7, 8, 9, or 10). Between each pair of two adjacent output wires of the m number of output wires of the fifth type, the driving apparatus comprises n number of output wires of the second type (e.g., data lines DL), n is an integer greater than 2, e.g., 3, 4, 5, 6, 7, 8, 9, or 10. Optionally, the driving apparatus further includes p number of output wires of the second type between a third power supply line and an output wire of the fifth type most adjacent to each other, p<n, and p is a positive integer.

In some embodiments, the one or more input wires of the third type include two third power supply lines two third power supply lines AVDD. The driving apparatus includes m number of input wires of the seventh type (e.g., sense lines SL) between the two third power supply lines, m is an integer greater than (e.g., 3, 4, 5, 6, 7, 8, 9, or 10). Between each pair of two adjacent input wires of the m number of input wires of the seventh type, the driving apparatus comprises n number of input wires of the fourth type (e.g., data lines DL), n is an integer greater than 2, e.g., 3, 4, 5, 6, 7, 8, 9, or 10. Optionally, the driving apparatus further includes p number of output wires of the second type between a third power supply line and an input wire of the seventh type most adjacent to each other, p<n, and p is a positive integer.

Figure 10:
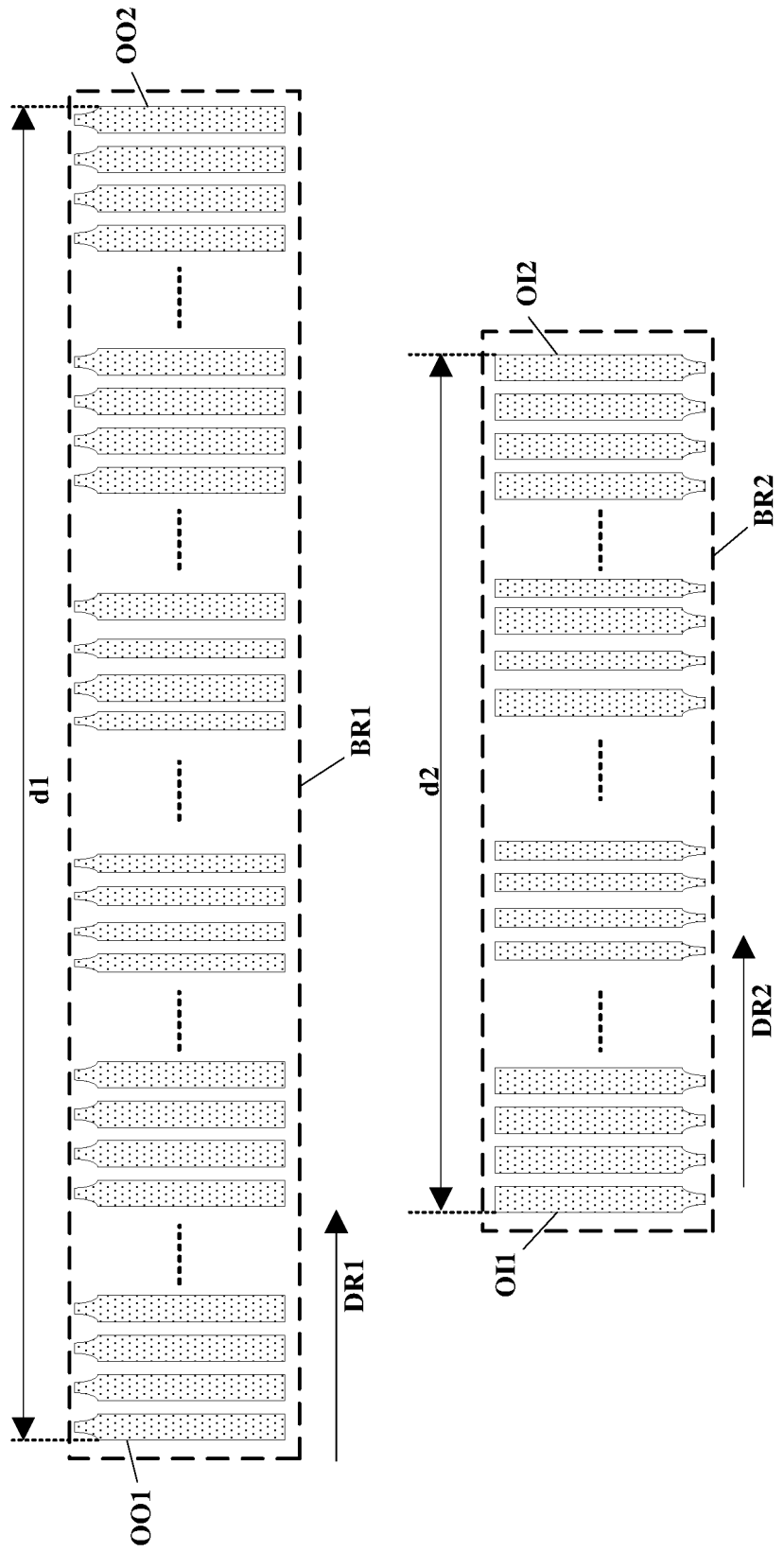
FIG. 10 illustrates an arrangement of a plurality of input wires and a plurality of output wires in a driving apparatus in some embodiments according to the present disclosure.

FIG. 10 illustrates an arrangement of a plurality of input wires and a plurality of output wires in a driving apparatus in some embodiments according to the present disclosure. Referring to FIG. 10, in the first bonding region BR1, a plurality of output wires are arranged. Two outmost output wires (001 and 002) are respectively on two opposite sides of the first bonding region BR1. A first shortest distance d1 denotes a shortest distance between the two outmost output wires along a first direction DR1 (e.g., a direction across the plurality of output wires). In the second bonding region BR2, a plurality of input wires are arranged. Two outmost input wires (O11 and O12) are respectively on two opposite sides of the second bonding region BR2. A second shortest distance d2 denotes a shortest distance between the two outmost input wires along a second direction DR2 (e.g., a direction across the plurality of input wires). In some embodiments, the first shortest distance d1 along the direction across the plurality of output wires between two outmost output wires is greater than a second shortest distance d2 along the direction across the plurality of input wires between two outmost input wires.

Optionally, the first shortest distance d1 along the direction across the plurality of output wires between two outmost output wires is greater than a second shortest distance d2 along the direction across the plurality of input wires between two outmost input wires by at least 1%, e.g., by at least 2%, by at least 3%, by at least 4%, by at least 5%, by at least 6%, by at least 7%, by at least 8%, by at least 9%, by at least 10%, by at least 11%, by at least 12%, by at least 13%, by at least 14%, by at least 15%, by at least 16%, by at least 17%, by at least 18%, by at least 19%, or by at least 20%.

Optionally, the first direction DR1 is parallel to the second direction DR2.

Optionally, the first direction DR1 is non-parallel to the second direction DR2.

In related driving apparatuses, the first shortest distance d1 and the second shortest distance d2 are typically the same. The inventors of the present disclosure discover that the output wires in the first bonding region BR1 are configured to be bonded to the display panel. As compared to the input wires in the second bonding region BR2 which are configured to be bonded to the circuit board, the output wires in the first bonding region BR1 are more prone to overheating issues. The inventors of the present disclosure discover that having the first shortest distance d1 greater than the second shortest distance d2 would allow more space for increasing the average line widths of at least some of the output wires.

Figure 11:
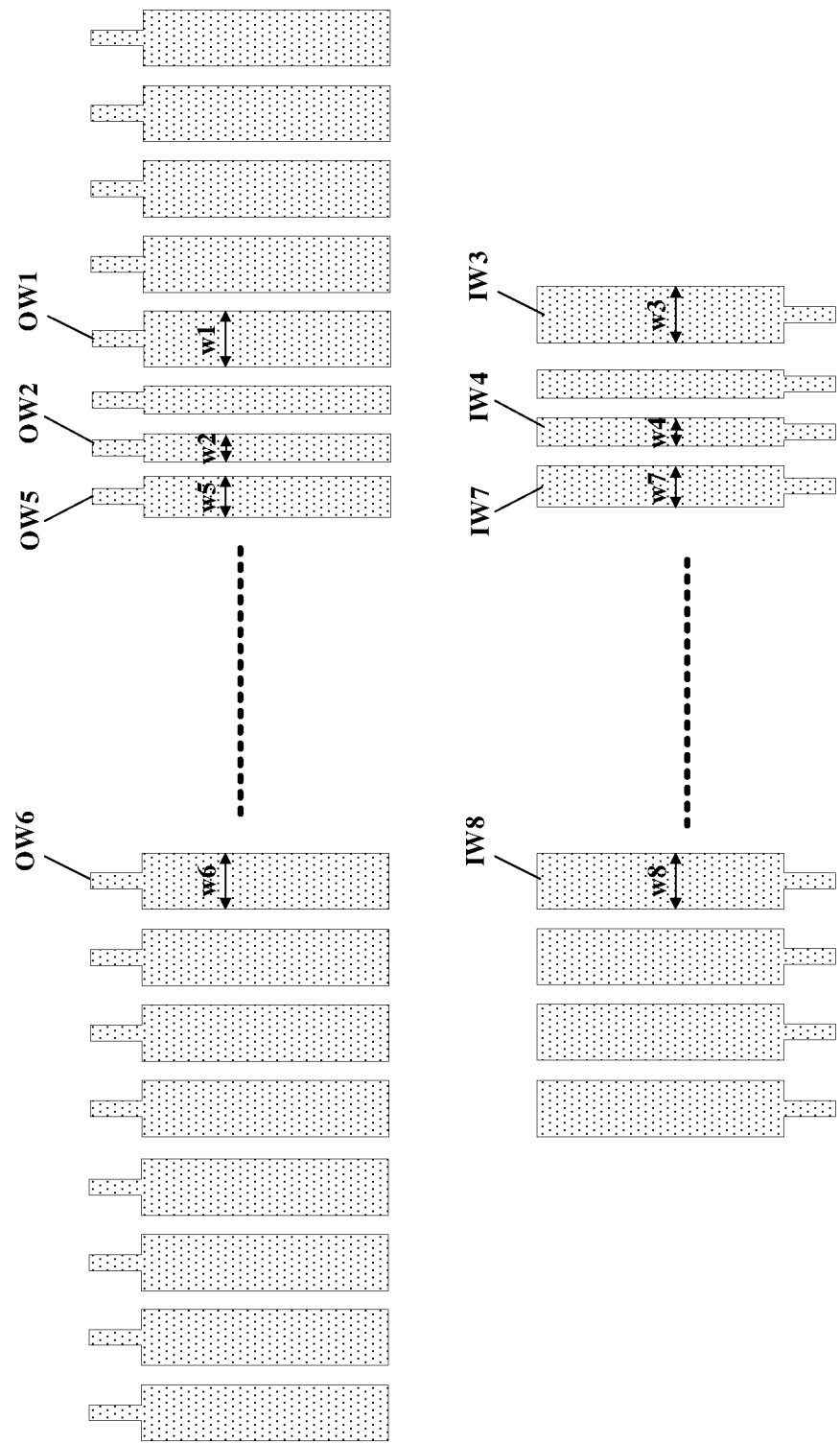
FIG. 11 illustrates an arrangement of a plurality of input wires and a plurality of output wires in a driving apparatus in some embodiments according to the present disclosure.

Accordingly, in some embodiments, output wires and input wires of a same type have different average line widths. FIG. 11 illustrates an arrangement of a plurality of input wires and a plurality of output wires in a driving apparatus in some embodiments according to the present disclosure. Referring to FIG. 11, in some embodiments, the plurality of output wires in the first bonding region includes one or more output wires OW1 of a first type having a first average line width w1, one or more output wires OW2 of a second type having a second average line width w2, one or more output wires OW5 of a fifth type having a fifth average line width w5, one or more output wires OW6 of a sixth type having a sixth average line width w6. The plurality of input wires in some embodiments includes one or more input wires IW3 of a third type having a third average line width w3, one or more input wires IW4 of a fourth type having a fourth average line width w4, one or more input wires IW7 of a seventh type having a seventh average line width w7, one or more input wires IW8 of an eighth type having an eighth average line width w8.

Optionally, the third type is the same as the first type, and the first average line width w1 is greater than the third average line width w3, e.g., by at least 1%, e.g., by at least 2%, by at least 3%, by at least 4%, by at least 5%, by at least 6%, by at least 7%, by at least 8%, by at least 9%, by at least 10%, by at least 11%, by at least 12%, by at least 13%, by at least 14%, by at least 15%, by at least 16%, by at least 17%, by at least 18%, by at least 19%, or by at least 20%.

Optionally, the fourth type is the same as the second type, and the second average line width w2 is greater than the fourth average line width w4, e.g., by at least 1%, e.g., by at least 2%, by at least 3%, by at least 4%, by at least 5%, by at least 6%, by at least 7%, by at least 8%, by at least 9%, by at least 10%, by at least 11%, by at least 12%, by at least 13%, by at least 14%, by at least 15%, by at least 16%, by at least 17%, by at least 18%, by at least 19%, or by at least 20%.

Optionally, the seventh type is the same as the fifth type, and the fifth average line width w5 is greater than the seventh average line width w7, e.g., by at least 1%, e.g., by at least 2%, by at least 3%, by at least 4%, by at least 5%, by at least 6%, by at least 7%, by at least 8%, by at least 9%, by at least 10%, by at least 11%, by at least 12%, by at least 13%, by at least 14%, by at least 15%, by at least 16%, by at least 17%, by at least 18%, by at least 19%, or by at least 20%.

Optionally, the eighth type is different from the sixth type, and the sixth average line width w6 is greater than the eighth average line width w8, e.g., by at least 1%, e.g., by at least 2%, by at least 3%, by at least 4%, by at least 5%, by at least 6%, by at least 7%, by at least 8%, by at least 9%, by at least 10%, by at least 11%, by at least 12%, by at least 13%, by at least 14%, by at least 15%, by at least 16%, by at least 17%, by at least 18%, by at least 19%, or by at least 20%.

Figure 12:
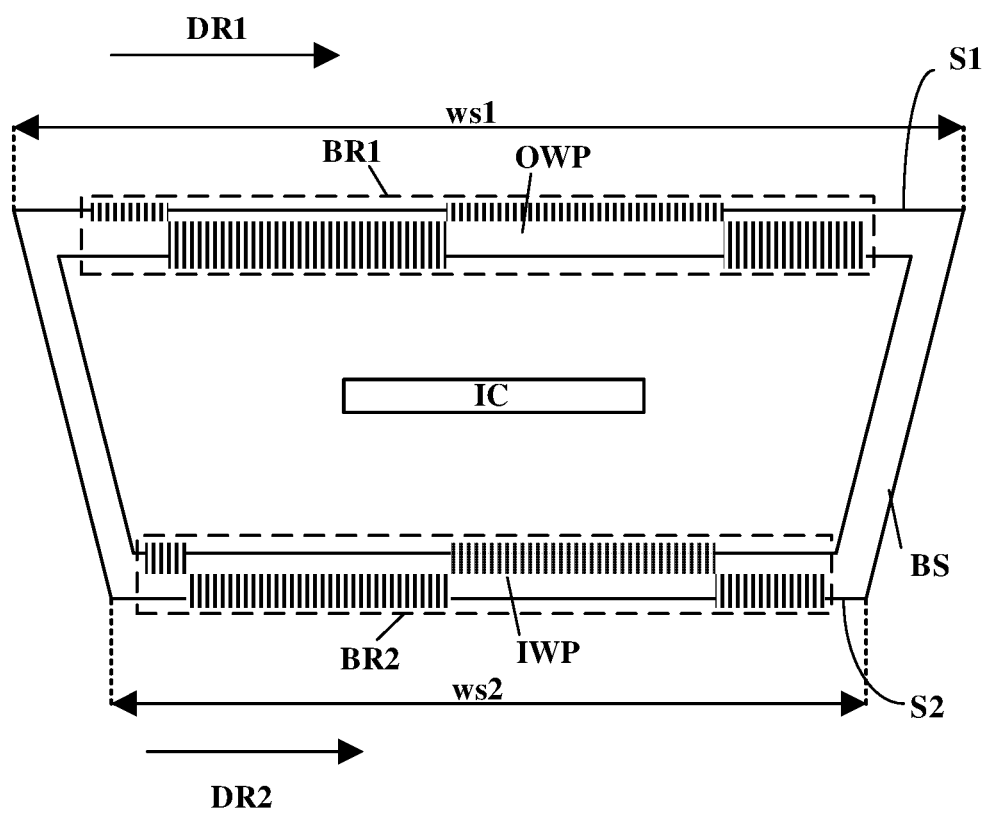
FIG. 12 is a schematic diagram illustrating the structure of a driving apparatus in some embodiments according to the present disclosure.
Figure 13:
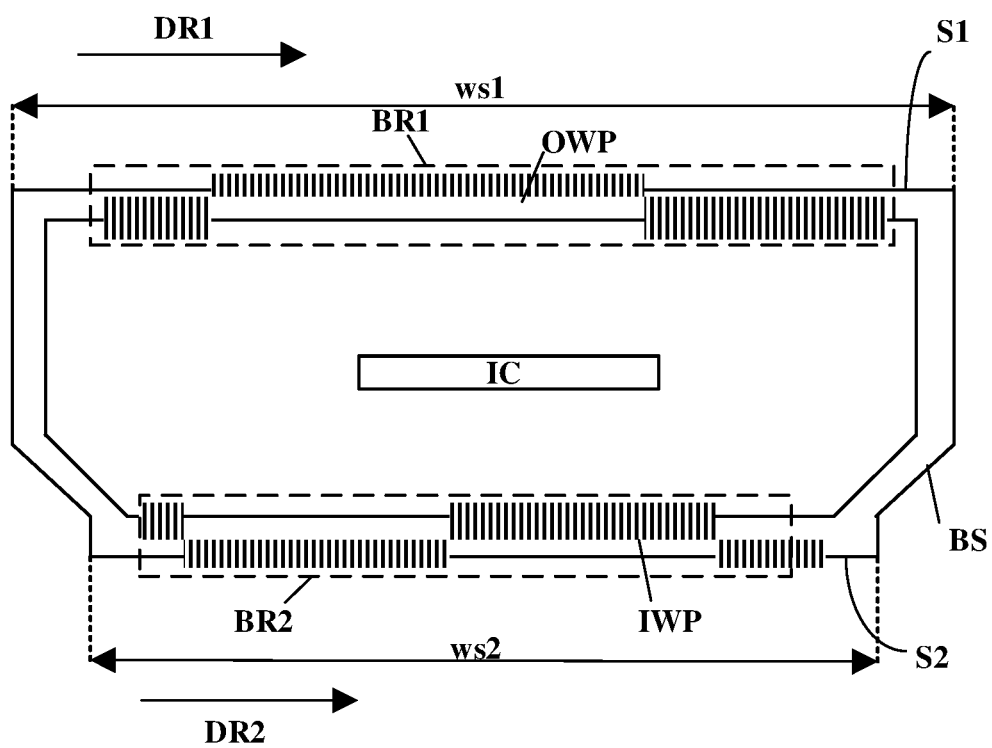
FIG. 13 is a schematic diagram illustrating the structure of a driving apparatus in some embodiments according to the present disclosure.

To accommodate the unique arrangement of output wires and input wires, the present disclosure provides a novel driving apparatus having a unique structure. FIG. 12 is a schematic diagram illustrating the structure of a driving apparatus in some embodiments according to the present disclosure. FIG. 13 is a schematic diagram illustrating the structure of a driving apparatus in some embodiments according to the present disclosure. Referring to FIG. 12 and FIG. 13, the driving apparatus in some embodiments includes the output wiring pattern OWP and the input wiring pattern IWP on the base substrate BS. The plurality of output wires of the output wiring pattern OWP are arranged along a first side S1 of the base substrate. The plurality of input wires of the input wiring pattern IWP are arranged along a second side S2 of the base substrate BS. The base substrate BS has a shape in which the first side S1 is wider than the second side S2.

As depicted in FIG. 12 and FIG. 13, the first side S1 has a first side width ws1 along a first direction DR1, the second side S2 has a second side width ws2 along a second direction DR2. Optionally, the first direction DR1 is a direction cross over (optionally perpendicular at least portions of the plurality of output wires) the plurality of output wires. Optionally, the second direction DR2 is a direction cross over (optionally perpendicular at least portions of the plurality of input wires) the plurality of input wires.

In one example, the first direction DR1 is parallel to the second direction DR2.

In another example, the first direction DR1 is non-parallel to the second direction DR2.

The base substrate BS may have various appropriate shapes. Examples of shapes of the base substrate BS include a trapezoidal shape, a triangular shape, a square shape, a rectangular shape, a parallelogram shape, a circle shape, an elliptical shape, an oval shape, a hexagon shape, a pentagon shape, a regular polygon shape, and an irregular polygon shape.

Referring to FIG. 12, the base substrate BS in one example has a trapezoidal shape.

Referring to FIG. 13, the base substrate BS in another example includes a first portion (the portion on the first side S1) having a rectangular shape and a second portion (the portion on the second side S2) having a trapezoidal shape. A long side of the trapezoidal shape connected to the rectangular shape. The plurality of output wires are on the first portion. The plurality of input wires are on the second portion.

In another aspect, the present disclosure provides a display apparatus. In some embodiments, the display apparatus includes the driving apparatus described herein or fabricated by a method described herein, a circuit board connected to the input wiring pattern, and a display panel connected to the output wiring pattern. Optionally, the display panel includes a plurality of bonding pads bonded to the plurality of output wires, respectively. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus. Optionally, the display apparatus is a quantum dots display apparatus.

In another aspect, the present disclosure provides a method of fabricating a driving apparatus. In some embodiments, the method includes forming an integrated circuit chip; forming an input wiring pattern connected to the integrated circuit chip, and configured to be connected to a circuit board; and forming an output wiring pattern comprising a plurality of output wires connected to the integrated circuit chip, and configured to be connected to a display panel. Optionally, the plurality of output wires are arranged in a first bonding region, at least two output wires of the plurality of output wires have different average line widths.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first". "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A driving apparatus, comprising:
an integrated circuit chip;
an input wiring pattern connected to the integrated circuit chip, and configured to be connected to a circuit board; and
an output wiring pattern comprising a plurality of output wires connected to the integrated circuit chip, and configured to be connected to a display panel;
wherein the plurality of output wires are arranged in a first bonding region, at least two output wires of the plurality of output wires have different average line widths.

2. The driving apparatus of claim 1, wherein the plurality of output wires comprise one or more output wires of a first type having a first average line width and one or more output wires of a second type having a second average line width; and
the first average line width and the second average line width are different.

3. The driving apparatus of claim 2, wherein the one or more output wires of the first type are configured to transmit signals of a first type;
the one or more output wires of the second type are configured to transmit signals of a second type;
the signals of the first type have an average current greater than the signals of the second type; and
the first average line width is greater than the second average line width.

4. The driving apparatus of claim 2, wherein the one or more output wires of the first type comprise a power supply signal line; and
the one or more output wires of the second type comprise a data line.

5. The driving apparatus of claim 1, wherein the input wiring pattern comprises a plurality of input wires arranged in a second bonding region, at least two input wires of the plurality of input wires have different average line width.

6. The driving apparatus of claim 5, wherein the plurality of input wires comprise one or more input wires of a third type having a third average line width and one or more output wires of a fourth type having a fourth average line width; and
the third average line width and the fourth average line width are different.

7. The driving apparatus of claim 6, wherein the one or more input wires of the third type are configured to transmit signals of a third type;
the one or more input wires of the fourth type are configured to transmit signals of a fourth type;
the signals of the third type have an average current greater than the signals of the fourth type; and
the third average line width is greater than the fourth average line width.

8. The driving apparatus of claim 2, wherein the plurality of output wires further comprise one or more output wires of a fifth type having a fifth average line width;
the fifth average line width is greater than the second average line width; and
the first average line width is greater than the fifth average line width.

9. The driving apparatus of claim 8, wherein the one or more output wires of the first type comprise two third power supply lines;
the driving apparatus comprises m number of output wires of the fifth type between the two third power supply lines, m is an integer greater than 2; and
between each pair of two adjacent output wires of the m number of output wires of the fifth type, the driving apparatus comprises n number of output wires of the second type, n is an integer greater than 2.

10. The driving apparatus of claim 8, wherein the one or more output wires of the first type comprise a power supply signal line;
the one or more output wires of the second type comprise a data line; and
the one or more output wires of the fifth type comprise a sense line.

11. The driving apparatus of claim 2, further comprising, in the first bonding region, one or more dummy lines that are floating;
wherein a respective dummy line is between two adjacent output wires of the first type of the one or more output wires of the first type to prevent short.

12. The driving apparatus of claim 6, wherein the plurality of input wires further comprise one or more input wires of a seventh type having a seventh average line width;
the seventh average line width is greater than the fourth average line width; and
the third average line width is greater than the seventh average line width.

13. The driving apparatus of claim 12, wherein the one or more input wires of the third type comprise two third power supply lines;
the driving apparatus comprises m number of input wires of the seventh type between the two third power supply lines, m is an integer greater than 2; and
between each pair of two adjacent input wires of the m number of input wires of the seventh type, the driving apparatus comprises n number of input wires of the fourth type, n is an integer greater than 2.

14. The driving apparatus of claim 6, further comprising, in the second bonding region, one or more dummy lines that are floating;
wherein a respective dummy line is between two adjacent input wires of the third type of the one or more input wires of the third type to prevent short.

15. The driving apparatus of claim 1, wherein the input wiring pattern comprises a plurality of input wires arranged in a second bonding region; and
- a first shortest distance along a direction across the plurality of output wires between two outmost output wires is greater than a second shortest distance along a direction across the plurality of input wires between two outmost input wires.

16. The driving apparatus of claim 1, further comprising a base substrate;
- wherein the input wiring pattern comprises a plurality of input wires arranged in a second bonding region;
- the output wiring pattern and the input wiring pattern on the base substrate;
- the plurality of output wires are arranged along a first side of the base substrate;
- the plurality of input wires are arranged along a second side of the base substrate; and
- the first side is wider than the second side.

17. The driving apparatus of claim 16, wherein the base substrate has a trapezoidal shape.

18. The driving apparatus of claim 16, wherein the base substrate comprises a first portion having a rectangular shape and a second portion having a trapezoidal shape;
- a long side of the trapezoidal shape connected to the rectangular shape;
- the plurality of output wires are on the first portion; and
- the plurality of input wires are on the second portion.

19. The driving apparatus of claim 1, wherein the driving apparatus is a chip-on-film.

20. A display apparatus, comprising the driving apparatus of claim 1, the circuit board connected to the input wiring pattern, and the display panel comprising a plurality of bonding pads bonded to the plurality of output wires, respectively.

* * * * *